United States Patent
Maeda et al.

(10) Patent No.: US 7,285,956 B2
(45) Date of Patent: Oct. 23, 2007

(54) NUCLEAR MAGNETIC RESONANCE DEVICE

(75) Inventors: Hideaki Maeda, Yokohama (JP); Shigeyuki Yokoyama, Yokohama (JP); Masashi Yasuda, Amagasaki (JP); Fumiaki Itojima, Amagasaki (JP); Masaki Tsuchiya, Amagasaki (JP)

(73) Assignees: Riken, Saitama (JP); Tokkyokiki Corporation, Hyogo (JP)

( * ) Notice: Subject to any disclaimer, the term of this patent is extended or adjusted under 35 U.S.C. 154(b) by 0 days.

(21) Appl. No.: 10/547,295

(22) PCT Filed: Mar. 17, 2004

(86) PCT No.: PCT/JP2004/003514

§ 371 (c)(1),
(2), (4) Date: May 4, 2006

(87) PCT Pub. No.: WO2004/083882

PCT Pub. Date: Sep. 30, 2004

(65) Prior Publication Data

US 2006/0202694 A1    Sep. 14, 2006

(30) Foreign Application Priority Data

Mar. 18, 2003  (JP)  ............................. 2003-074168

(51) Int. Cl.
   *G01V 3/00*   (2006.01)
(52) U.S. Cl. ..................................... 324/318; 324/322
(58) Field of Classification Search ........ 324/300–322; 188/378, 379, 380, 267; 335/296–320, 216
See application file for complete search history.

(56) References Cited

U.S. PATENT DOCUMENTS 5,899,443 A * 5/1999 Su ........................ 267/140.14

(Continued)

FOREIGN PATENT DOCUMENTS

EP      0 655 220        5/1995

(Continued)

OTHER PUBLICATIONS

Y. Tagawa et al., Kikai Rikigaku Keisoku Seigyo Koen Ronbunshu (B), No. 940-26, "6DOF Microvibration Control System Using Air Actuators (Experimental Study on Vibration Isolation and Damping Performance)", Jun. 30, 1994, vol. B, pp. 544-547.

*Primary Examiner*—Brij Shrivastav
(74) *Attorney, Agent, or Firm*—Wenderoth, Lind & Ponack, L.L.P.

(57) ABSTRACT

A nuclear magnetic resonance apparatus includes a nuclear magnetic resonance device for elucidating atomic configuration and molecular structure of a substance based on a decay signal of induced electromotive force caused by resonance precession of nuclear magnetic moment induced by irradiation of electro-magnetic pulses in an RF region when the substance is exposed to a strong magnetic field, and a vibration isolation mechanism for suppressing vibrations. The vibration isolation mechanism has, as an actuator, an air spring connected to a pressurized air source via an electro-pneumatic converter and acting to exert a force for vibration isolation on the nuclear magnetic resonance device. The vibration isolation mechanism is capable of active vibration isolation, and disposed away from the nuclear magnetic resonance device by such a distance that the electro-pneumatic converter never incurs any malfunctions or operating failures under influence of a magnetic field generated by the nuclear magnetic resonance device.

15 Claims, 6 Drawing Sheets

U.S. PATENT DOCUMENTS

| | | | |
|---|---|---|---|
| 6,505,718 B2 * | 1/2003 | Fujita et al. | 188/267 |
| 6,549,010 B2 * | 4/2003 | Roozen et al. | 324/318 |
| 6,758,312 B2 * | 7/2004 | Heiland | 188/378 |
| 6,774,633 B2 * | 8/2004 | Wang et al. | 324/318 |
| 6,808,051 B2 * | 10/2004 | Warmerdam | 188/380 |
| 2003/0076205 A1 * | 4/2003 | Wang et al. | 335/299 |

FOREIGN PATENT DOCUMENTS

| | | |
|---|---|---|
| JP | 1-165010 | 11/1989 |
| JP | 7-204176 | 8/1995 |
| JP | 8-273570 | 10/1996 |
| JP | 9-129167 | 5/1997 |
| JP | 9-218174 | 8/1997 |
| JP | 2000-83920 | 3/2000 |
| JP | 2000-179615 | 6/2000 |
| JP | 2001-20997 | 1/2001 |
| JP | 2001-314420 | 11/2001 |
| JP | 2003-74620 | 3/2003 |

* cited by examiner

NUCLEAR MAGNETIC RESONANCE DEVICE

TECHNICAL FIELD

The present invention relates to a nuclear magnetic resonance apparatus equipped with a vibration isolation mechanism.

BACKGROUND ART

Conventionally, a nuclear magnetic resonance apparatus has been known which comprises a nuclear magnetic resonance means for elucidating an atom configuration and a molecular structure of a substance based on a decay signal of induced electromotive force caused by resonance precession of nuclear magnetic moment induced by irradiation of electro-magnetic pulses in an RF region when a substance is exposed to a strong magnetic field, and a vibration isolation mechanism for suppressing vibration of this nuclear magnetic resonance means (see e.g., Japanese Patent Laid-Open publication No. 2001-145611, paragraph [0011], FIG. 1).

A vibration isolation mechanism itself of an active type using an air spring has also been known (see, e.g., "6DOF microvibration Control System using Air Actuators (Experimental Study on Vibration Isolation and Damping Performance)", Yasutaka TAGAWA and four others, Proceedings of Dynamics and Design Conference'94, JSME, No. 940-26(II), pp. 544, 1994.07).

In a vibration isolation mechanism constituted by a spring-mass system (a surface plate and a mounted component), i.e. a vibration isolation mechanism of the passive type, vibration is amplified by resonance at a natural frequency of the spring-mass system. In contrast to this, the vibration isolation mechanism of the active type is a vibration isolation mechanism comprising a means for detecting a vibration state or a displacement state of a component to be isolated from vibration, namely, a controlled object, a control means for outputting a signal to cancel the vibration of the controlled object based on a detected signal by the detection means, an actuator (e.g., air spring, piezoelectric laminate) for exerting a force on the controlled object to cancel the vibration by receiving a signal from the control means, and the like, whereby feedback control is performed to avoid the resonance at the natural frequency and to suppress the amplification of the vibration by the resonance. This active type vibration isolation mechanism has become indispensable particularly for precision mechanical equipment adversely affected easily even by micro-vibration.

In the case of the apparatus described in the Japanese Patent Laid-Open publication No. 2001-145611 in which a passive-type vibration isolation mechanism is employed as the vibration isolation mechanism, since a vibration is amplified at around the natural frequency as described above, the vibration isolation mechanism is unsuitable for vibration isolation of a nuclear magnetic resonance apparatus which is a precision measuring instrument. That is, in the case of the nuclear magnetic resonance apparatus using the passive type vibration mechanism, since the vibration of the apparatus causes side band noise in a nuclear magnetic spectrum responsive to a frequency of the vibration, such a problem arises that precision measurement can not be performed by the apparatus.

On the other hand, the aforementioned active type vibration isolation mechanism employs such a constituent element as a servo valve or a servo acceleration sensor which may lead to malfunctions or operating failures under the influence of an external strong magnetic field. Therefore, even if a nuclear magnetic resonance apparatus formed by applying this active type vibration isolation mechanism of the conventional type to the nuclear magnetic resonance means which is a source of a strong magnetic field, such a problem arises that the vibration isolation mechanism does not operate normally, with the result that it becomes impossible to perform precision measurement also by this nuclear magnetic resonance apparatus as in the foregoing case.

It is an object of the present invention to provide a nuclear magnetic resonance apparatus which solves the above-described problems of the prior art and which allows the vibration isolation mechanism to fully exert an inherent performance even under a strong magnetic field, thereby suppressing vibration and enabling precision measurement.

DISCLOSURE OF THE INVENTION

In order to achieve the above object, according to a first aspect of the present invention, there is provided a nuclear magnetic resonance apparatus comprising: a nuclear magnetic resonance means for elucidating an atom configuration and a molecular structure of a substance based on a decay signal of induced electromotive force caused by resonance precession of nuclear magnetic moment induced by irradiation of electro-magnetic pulses in an RF region when a substance is exposed to a strong magnetic field; and a vibration isolation mechanism for suppressing vibration of this nuclear magnetic resonance means, wherein the vibration isolation mechanism has an air spring as an actuator, the air spring being connected to a pressurized air source via an electro-pneumatic converter and acting to exert a force for vibration isolation on the nuclear magnetic resonance means, and the vibration isolation mechanism is formed so as to be capable of active vibration isolation, and disposed away from the nuclear magnetic resonance means by such a distance that the electro-pneumatic converter never incurs any malfunctions or operating failures under influence of a magnetic field generated by the nuclear magnetic resonance means.

With this constitution, the leak magnetism from the nuclear magnetic resonance means is weakened in the vicinity of the electro-pneumatic converter, thus producing effects that the inherent performance of the vibration isolation mechanism can be fully obtained even under a strong magnetic field, the vibration is suppressed without incurring amplification of the vibration due to the resonance at the natural frequency, and that precision measurement can be performed.

According to a second aspect of the present invention, there is provided a nuclear magnetic resonance apparatus comprising: a nuclear magnetic resonance means for elucidating an atom configuration and a molecular structure of a substance based on a decay signal of induced electromotive force caused by resonance precession of nuclear magnetic moment induced by irradiation of electro-magnetic pulses in an RF region when a substance is exposed to a strong magnetic field; and a vibration isolation mechanism for suppressing vibration of this nuclear magnetic resonance means, wherein the vibration isolation mechanism has an air spring as an actuator, the air spring being connected to a pressurized air source via an electro-pneumatic converter and acting to exert a force for vibration isolation on the nuclear magnetic resonance means, and the vibration isolation mechanism is formed so as to be capable of active vibration isolation, and the electro-pneumatic converter is accompanied by a means for decaying a magnetic field leaking outside from the nuclear magnetic resonance means and is disposed at such a position that the leakage magnetic field is decayed.

With this constitution, the leakage magnetic field from the nuclear magnetic resonance means is weakened by the means for decaying the magnetic field, and the electro-pneumatic converter is protected from this leakage magnetic field, thus producing effects that the inherent performance of the vibration isolation mechanism can be fully obtained even under a strong magnetic field, the vibration is suppressed without incurring amplification of the vibration due to the resonance at the natural frequency, and that precision measurement can be performed.

According to a third aspect of the present invention, there is provided a nuclear magnetic resonance apparatus comprising: a nuclear magnetic resonance means for elucidating an atom configuration and a molecular structure of a substance based on a decay signal of induced electromotive force caused by resonance precession of nuclear magnetic moment induced by irradiation of electro-magnetic pulses in an RF region when a substance is exposed to a strong magnetic field; and a vibration isolation mechanism for suppressing vibration of this nuclear magnetic resonance means, wherein the vibration isolation mechanism has an air spring as an actuator, the air spring being connected to a pressurized air source via an electro-pneumatic converter and acting to exert a force for vibration isolation on the nuclear magnetic resonance means, and the vibration isolation mechanism is formed so as to be capable of active vibration isolation, and the electro-pneumatic converter is disposed so as to generate a driving magnetic field perpendicular to a direction of a leakage flux from the nuclear magnetic resonance means.

With this constitution, a driven portion within the electro-pneumatic converter operates normally without being affected by the magnetic field due to the nuclear magnetic resonance means, thus producing effects that the inherent performance of the vibration isolation mechanism can be fully obtained even under a strong magnetic field, the vibration is suppressed without incurring amplification of the vibration due to the resonance at the natural frequency, and that precision measurement can be performed.

According to a fourth aspect of the present invention, in addition to the constitution of any one of the first to third aspects, the air spring and piping system are formed of nonmagnetic material.

With this constitution, in addition to the effects of any one of the first to third aspects of the invention, there are produced effects that the influence of the magnetic field due to the nuclear magnetic resonance means to which the electro-pneumatic converter is subject is further weakened, and that the reliability of the apparatus can be further improved.

According to a fifth aspect of the present invention, in addition to the constitution of any one of the first to fourth aspects, a control means of the vibration isolation mechanism performs such a control that controlling pressure generated by the electro-pneumatic converter is lowered at around a fluid resonance frequency so as to suppress occurrence of fluid resonance between the air spring and the electro-pneumatic converter.

With this constitution, in addition to the effects of any one of the first to fourth aspects of the invention, there are produced effects that the active vibration isolation can be fulfilled even when the control pressure by the electro-pneumatic converter fluctuates at around the fluid resonance frequency, as in the case of other frequencies, and that the reliability of the apparatus can be further improved.

According to a sixth aspect of the present invention, in addition to the constitution of any one of the first to fifth aspects, the vibration isolation mechanism includes a piezoelectric acceleration sensor as a vibration detection means.

With this constitution, in addition to the effects of any one of the first to fifth aspects of the invention, there is produced an effect that the vibration state of the nuclear magnetic resonance means can be detected without being affected by a strong magnetic field.

According to the seventh aspect of the present invention, in addition to the constitution of any one of the first to fifth aspects, the vibration isolation mechanism includes a servo acceleration sensor as a vibration detection means, and this servo acceleration sensor includes a means for decaying a magnetic field leaking outside from the nuclear magnetic resonance means and is disposed at such a position that the leakage magnetic field is decayed.

With this constitution, in addition to the effects of any one of the first to fifth aspects of the invention, there is produced an effect that a servo acceleration sensor most suitable for micro-vibration measurement becomes applicable also to the detection of the vibration state of the nuclear magnetic resonance means.

DETAILED DESCRIPTION OF PREFERRED EMBODIMENTS

Hereinafter, embodiments of the present invention are described with reference to the drawings.

Figure 1:
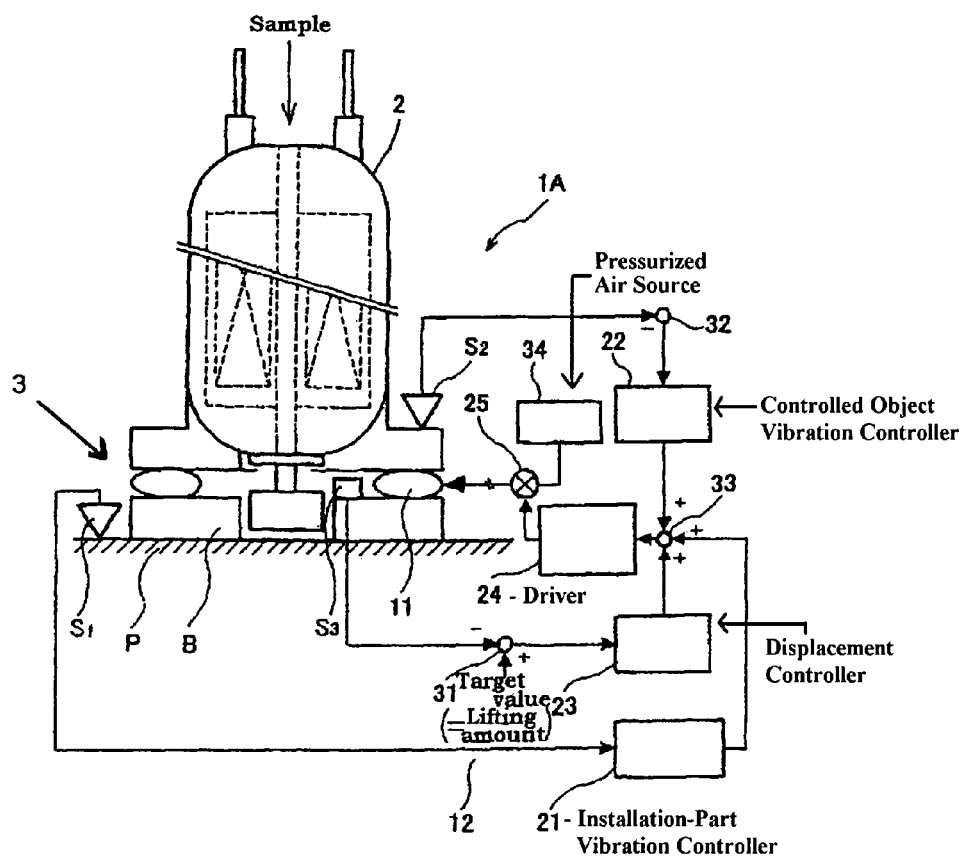
FIG. 1 is a block diagram showing the overall construction of a nuclear magnetic resonance apparatus according to the present invention.

FIG. 1 shows a nuclear magnetic resonance apparatus 1A according to the present invention, and this nuclear magnetic resonance apparatus 1A is comprised of a nuclear magnetic resonance means 2 and a vibration isolation mechanism 3.

The nuclear magnetic resonance means 2, which is a well known one including a magnetic resonance imaging means, is intended to elucidate an atomic configuration and a molecular structure of a substance based on a decay signal of induced electromotive force caused by resonance precession of nuclear magnetic moment induced by irradiation of electro-magnetic pulses in an RF region when the substance is exposed to a strong magnetic field.

The vibration isolation mechanism 3, which is provided for active vibration isolation of the nuclear magnetic resonance means 2, is comprised of an air spring 11 as an actuator and a control system 12 including vibration sensors $S_1$, $S_2$, displacement sensor $S_3$ or the like as detection means.

The air spring 11 is interposed between a base B disposed on an installation part P adjustably in horizontal level and the nuclear magnetic resonance means 2 which is a vibration controlled object by the vibration isolation mechanism 3. In other words, the nuclear magnetic resonance means 2 is supported horizontally on the base B via the air spring 11.

In addition to the aforementioned detection means (vibration sensors $S_1$, $S_2$, displacement sensor $S_3$), the control system 12 is provided with an installation-part vibration controller 21, a controlled-object vibration controller 22, a displacement controller 23, a driver 24 and an electro-pneumatic converter 25.

The vibration sensor $S_1$ detects a vibration state of the installation part P, and a signal showing the detected vibration state is inputted to the installation-part vibration controller 21. The vibration sensor $S_2$ detects a vibration state of the nuclear magnetic resonance means 2, and a signal showing the detected vibration state is inputted to an adder 31 and, inputted to the controlled-object vibration controller 22 with its positive/negative polarity inverted. The displacement sensor $S_3$ detects a relative displacement amount of the nuclear magnetic resonance means 2 to the installation part P, and a signal showing the displacement amount is inputted to an adder 32 as a negative signal. In the adder 32, a value of desired lifting amount of the nuclear magnetic resonance means 2 from the installation part P has been inputted as a target value, and a signal showing a difference between this desired lifting amount and the relative displacement amount is inputted from the adder 32 to the displacement controller 23.

The vibration sensors $S_1$, $S_2$ are basically seismic-system's ones composed of, for example, piezoelectric elements and nonmagnetic masses, and preferably piezoelectric acceleration sensors that are not affected by any magnetic field. Alternatively, the vibration sensors $S_1$, $S_2$ may be servo acceleration sensors accompanied by a means for decaying the magnetic field leaking outside from the nuclear magnetic resonance means 2, and disposed at such a position that the leakage magnetic field is decayed. Although the servo acceleration sensors are affected by the magnetic field because each of them includes an electro-magnetic driver portion of voice coil type, the servo acceleration sensors are superior in micro-vibration resolution characteristics to the piezoelectric acceleration sensors. The means for decaying the magnetic field will be described later.

Furthermore, preferably, the displacement sensor $S_3$ is, for example, an eddy-current type displacement sensor or a laser displacement meter.

From each of the installation-part vibration controller 21, the control-object vibration controller 22 and the displacement controller 23, a control signal for canceling each of their input signals is inputted to an adder 33, and a control signal resulting from summing up these three control signals is inputted from the adder 33 to the driver 24.

The air spring 11 is connected to a pressurized air source 34 via the electro-pneumatic converter 25 disposed at a position distant from the nuclear magnetic resonance means 2 by such a distance that the air spring 11 never incurs any malfunctions or operating failures under the influence of a magnetic field generated by the nuclear magnetic resonance means 2, more specifically, at a position where the magnetic flux density becomes about 5 gauss or less, and the electro-pneumatic converter 25 operates based on a driving signal from the driver 24, to which the control signal resulting from summing up the three control signal has been inputted. That is, the electro-pneumatic converter 25 promptly responds to the aforementioned two vibration states and displacement amount, so as to continuously adjust the pressurized air amount inside the air spring 11, to thereby perform vibration isolation of the nuclear magnetic resonance means 2.

As the electro-pneumatic converter 25, for example, an electro-pneumatic servo valve whose flapper is operated by magnet may be used.

Figure 2:
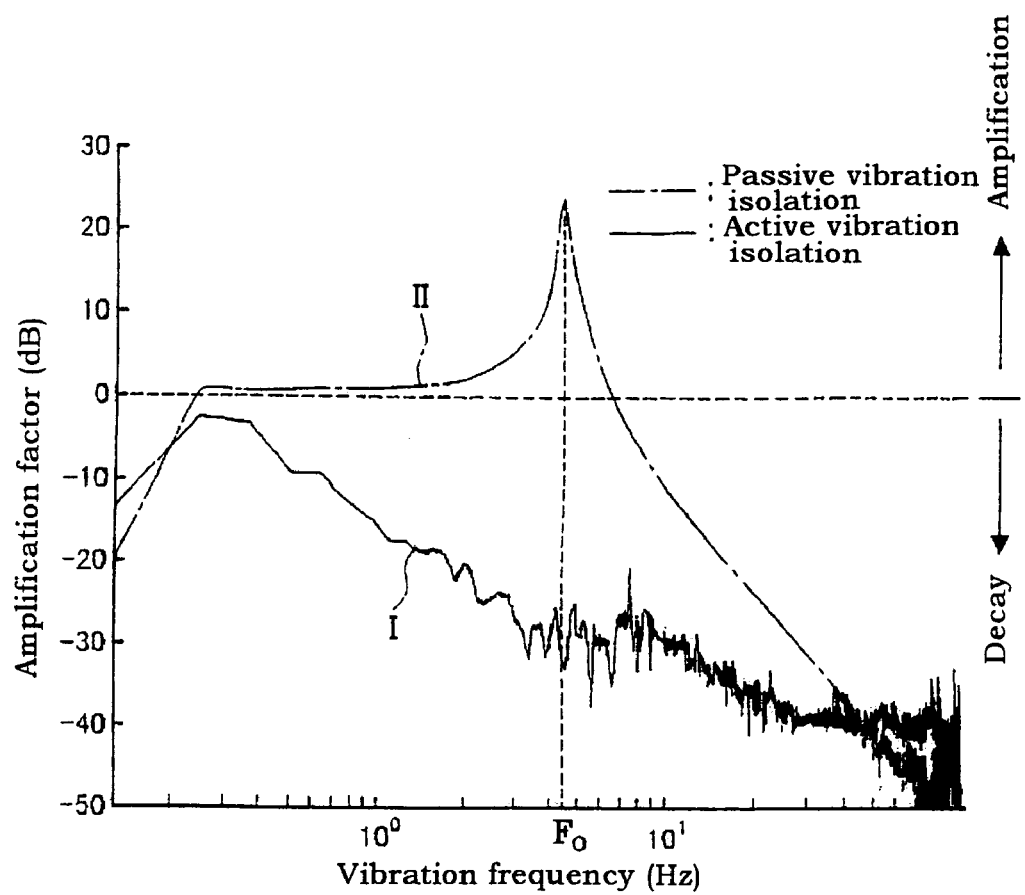
FIG. 2 is a graph showing vibration isolation characteristics of the nuclear magnetic resonance apparatus shown in FIG. 1 and a nuclear magnetic resonance apparatus using a passive type vibration isolation mechanism.

FIG. 2 shows, by using the vibration state of the installation part P as a reference, vibration isolation characteristics of the nuclear magnetic resonance apparatus 1A according to the present invention, in which the above-described active type vibration isolation mechanism is applied to the nuclear magnetic resonance means 2 generating a strong magnetic field, as well as vibration isolation characteristics of a conventional nuclear magnetic resonance apparatus in which a passive type vibration isolation mechanism formed of a spring-mass system is applied to the nuclear magnetic resonance means 2. In FIG. 2, the horizontal axis represents the vibration frequency (Hz) expressed in the logarithmic scale, $F_0$ represents a first order natural frequency, and the vertical axis represents the amplification factor [dB] of vibrations of the nuclear magnetic resonance means 2 when the vibration level of the installation part P is taken as a reference (=0), and a curve I corresponds to a case of the nuclear magnetic resonance apparatus 1A under the active vibration isolation and a curve II corresponds to the case of the conventional nuclear magnetic resonance apparatus under the passive vibration isolation. As can be seen from this FIG. 2, in the region higher than the natural frequency $F_0$, both the nuclear magnetic resonance apparatus 1A and the conventional nuclear magnetic resonance apparatus show similarly good damping characteristics. At around the natural frequency $F_0$, the conventional nuclear magnetic resonance apparatus amplifies the vibrations, while the nuclear magnetic resonance apparatus 1A shows good damping characteristics.

Figure 3:
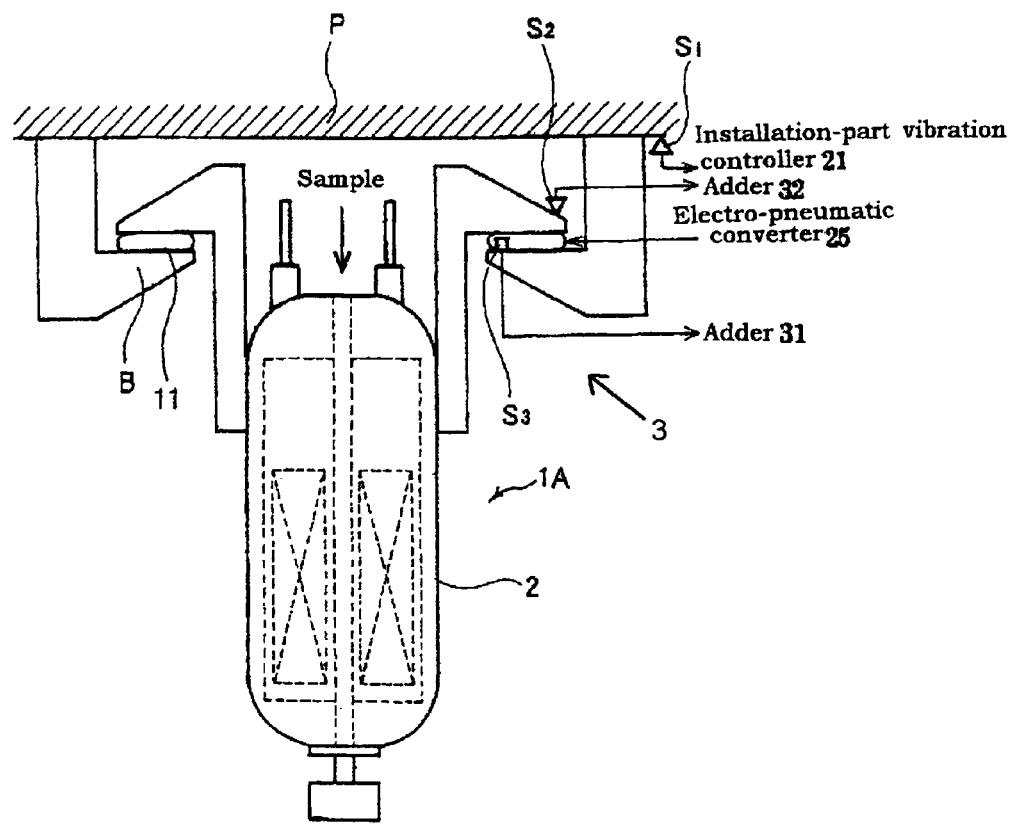
FIG. 3 shows another configuration for supporting a nuclear magnetic resonance means of the nuclear magnetic resonance apparatus shown in FIG. 1.
Figure 4:
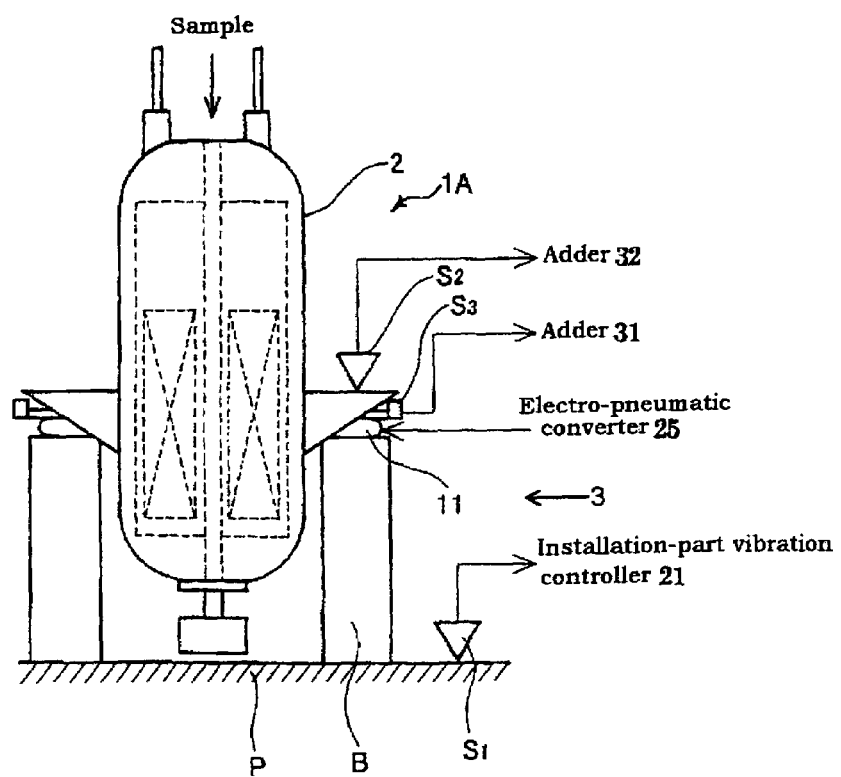
FIG. 4 shows still another configuration for supporting the nuclear magnetic resonance means of the nuclear magnetic resonance apparatus shown in FIG. 1.

The present invention is not limited to the one in which the nuclear magnetic resonance means 2 is supported as shown in FIG. 1, but includes those in which the nuclear magnetic resonance means 2 is supported in such a manner as shown in FIG. 3 or 4, where components of FIGS. 3 and 4 common to those of FIG. 1 are designated by like reference numerals.

It is noted that the nuclear magnetic resonance means 2 shown in FIG. 3 has its upper portion supported horizontally on the base B via the air spring 11, while the nuclear magnetic resonance means 2 shown in FIG. 4 has its side portion supported horizontally on the surface plate B via the air spring 11.

Figure 5:
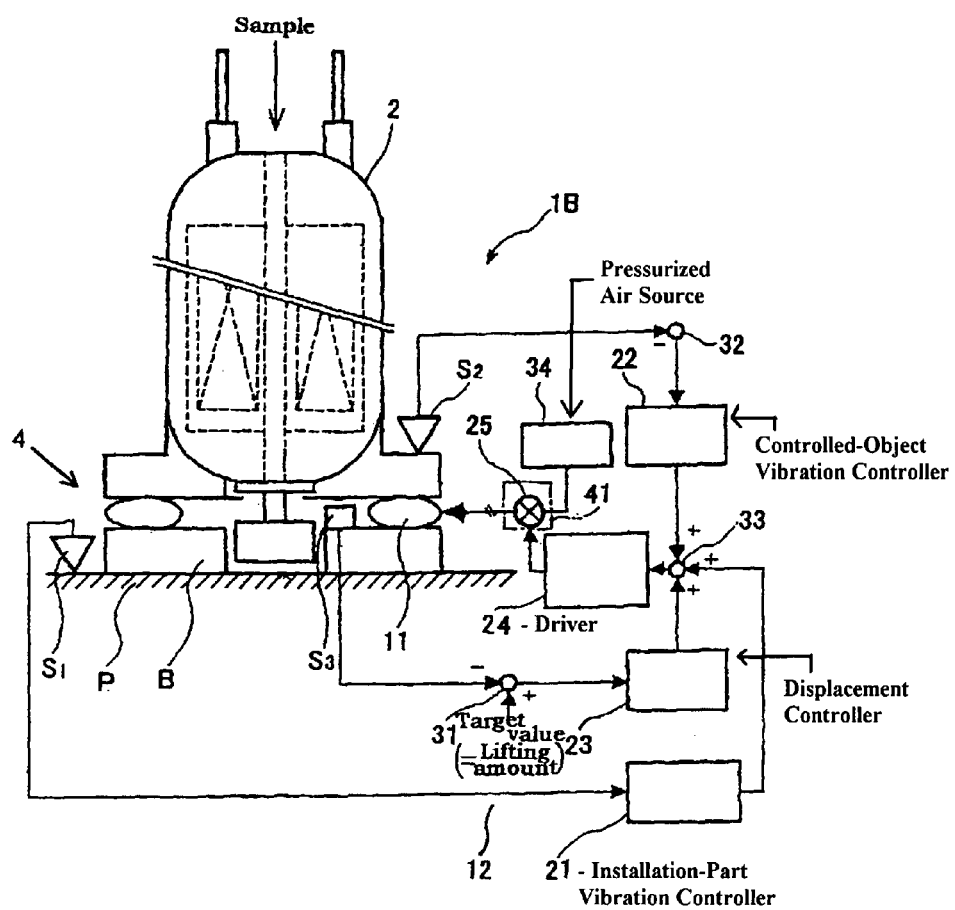
FIG. 5 is a block diagram showing the overall construction of another nuclear magnetic resonance apparatus according to the present invention and its state of application.

FIG. 5 shows another nuclear magnetic resonance apparatus 1B according to the present invention, which is substantially similar to the above-described nuclear magnetic resonance apparatus 1A except that an active type vibration isolation mechanism 4 is applied instead of the vibration isolation mechanism 3, where components common to each other are designated by like reference numerals and their description omitted.

In this nuclear magnetic resonance apparatus 1B, an electro-pneumatic converter 25 is housed within a magnetic shield box 41, which is an example of the means for decaying the magnetic field leaking outside from the nuclear magnetic resonance apparatus 1B. Therefore, this electro-pneumatic converter 25 is not necessarily located away from the nuclear magnetic resonance means 2 as in the case of the nuclear magnetic resonance apparatus 1A.

In this nuclear magnetic resonance apparatus 1B, a magnetic field as a disturbance to the electro-pneumatic converter 25 is interrupted by the magnetic shield box 41, by which the influence of the external magnetic field on the electro-pneumatic converter 25 is eliminated. As a result, normal operation of the electro-pneumatic converter 25 is ensured. This magnetic shield box 41 is preferably formed of a material having high magnetic permeability such as permalloy or pure iron.

As a means for decaying the magnetic field, for example, a permanent magnet or a magnetism generation coil may be used instead of or in addition to the above magnetic shield box.

In this case, by a magnetic field generated from the permanent magnet or magnetism generation coil, a leakage magnetic field from the nuclear magnetic resonance apparatus 1B incident on the electro-pneumatic converter 25 is degaussed, or the incidence amount of the leakage magnetic field in a sensitive direction of the electro-pneumatic converter 25 is decreased.

In addition, also in this nuclear magnetic resonance apparatus 1B, needless to say, piezoelectric acceleration sensors or servo acceleration sensors may be applied as the vibration sensors $S_1$, $S_2$, and an eddy-current type displacement sensor or a laser displacement gauge may be applied as the displacement sensor $S_3$, as described above.

Figure 6:
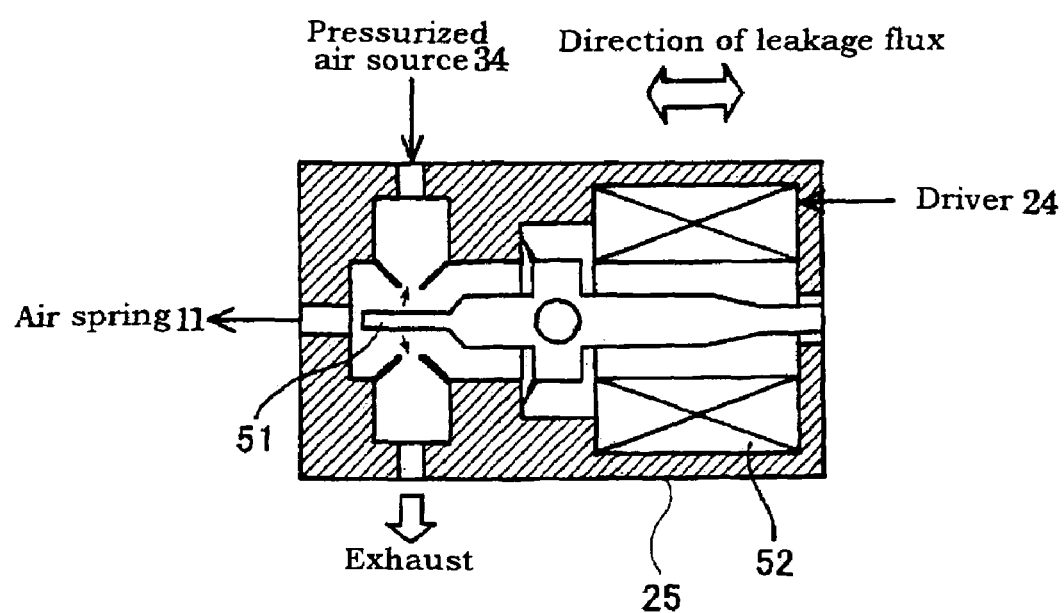
FIG. 6 is a sectional view of an electro-pneumatic converter which generates a driving magnetic field perpendicular to the direction of a leakage flux from the nuclear magnetic resonance means.

The present invention is not limited to the above embodiments. That is, the electro-pneumatic converter 25 does not necessarily need to be disposed away from the nuclear magnetic resonance means 2 as in the case of the nuclear magnetic resonance apparatus 1A, and further the electro-pneumatic converter 25 does not necessarily need to be disposed within the magnetic shield box 41 as in the case of the nuclear magnetic resonance apparatus 1B. Instead, as shown in FIG. 6, the electro-pneumatic converter 25 may be so disposed as to generate a driving magnetic field perpendicular to the direction of a leakage flux from the nuclear magnetic resonance means 2, and the present invention includes a nuclear magnetic resonance apparatus of such construction as well. It is noted that in FIG. 6, reference numeral 51 denotes a flapper and 52 denotes a torque-motor driving magnetic pole.

By the arrangement that the electro-pneumatic converter 25 is so disposed as to generate a driving magnetic field perpendicular to the direction of a leakage flux from the nuclear magnetic resonance means 2 as shown above, the influence of the magnetic field due to the nuclear magnetic resonance means 2 to which the electro-pneumatic converter 25 is subject is weakened.

Also, in each of the above-described apparatuses, the air spring 11 and the piping system are preferably formed of nonmagnetic material. By doing so, the influence of the magnetic field due to the nuclear magnetic resonance means 2 to which the electro-pneumatic converter 25 is subject is further weakened.

Further, in each of the above-described apparatuses, in order to suppress fluid resonance that occurs between the air spring 11 and the electro-pneumatic converter 25, it is preferable that the controlling pressure generated by the electro-pneumatic converter 25 is lowered at around the fluid resonance frequency. In execution of the pressure control in the air spring 11 by means of the servo valve in the electro-pneumatic converter 25, when pressurized fluid is subjected to a volumetric change through the piping system extending from the pressurized air source 34, there would occur internal resonance which would cause the fluid to resonate, resulting in deterioration of the control characteristics. However, by correcting the controlling pressure generated by the electro-pneumatic converter 25 as described above, it becomes possible to fulfill the active vibration isolation even when the controlling pressure in the electro-pneumatic converter 25 fluctuates at around the fluid resonance frequency, as in the case of other frequencies.

In addition, in the feedback loop, a resonance eliminating filter may be interposed, for example, between the adder 33 and the driver 24.

The invention claimed is:

1. A nuclear magnetic resonance apparatus comprising: nuclear magnetic resonance means for elucidating atomic configuration and molecular structure of a substance based on a decay signal of induced electromotive force caused by resonance precession of nuclear magnetic moment induced by irradiation of electro-magnetic pulses in an RF region when the substance is exposed to a strong magnetic field; and a vibration isolation mechanism for suppressing vibration of this nuclear magnetic resonance means, wherein the vibration isolation mechanism has an air spring as an actuator, the air spring being connected to a pressurized air source via an electro-pneumatic converter and acting to exert a force for vibration isolation on the nuclear magnetic resonance means, and the vibration isolation mechanism is formed so as to be capable of active vibration isolation, and disposed away from the nuclear magnetic resonance means by such a distance that the electro-pneumatic converter never incurs any malfunctions or operating failures under influence of a magnetic field generated by the nuclear magnetic resonance means, and wherein a control means in the vibration isolation mechanism performs such a control that controlling pressure generated by the electro-pneumatic converter is lowered at around a fluid resonance frequency so as to suppress occurrence of fluid resonance between the air spring and the electro-pneumatic converter.

2. The nuclear magnetic resonance apparatus as claimed in claim 1, wherein the air spring and piping system are formed of nonmagnetic material.

3. The nuclear magnetic resonance apparatus as claimed in claim 2, wherein the vibration isolation mechanism includes a piezoelectric acceleration sensor as a vibration detection means.

4. The nuclear magnetic resonance apparatus as claimed in claim 2, wherein the vibration isolation mechanism includes a servo acceleration sensor as a vibration detection means, and this servo acceleration sensor includes a means for decaying a magnetic field leaking outside from the nuclear magnetic resonance means and is disposed at such a position that the leakage magnetic field is decayed.

5. The nuclear magnetic resonance apparatus as claimed in claim 1, wherein the vibration isolation mechanism includes a piezoelectric acceleration sensor as a vibration detection means.

6. The nuclear magnetic resonance apparatus as claimed in claim 1, wherein the vibration isolation mechanism includes a servo acceleration sensor as a vibration detection means, and this servo acceleration sensor includes a means for decaying a magnetic field leaking outside from the nuclear magnetic resonance means and is disposed at such a position that the leakage magnetic field is decayed.

7. A nuclear magnetic resonance apparatus comprising: a nuclear magnetic resonance means for elucidating atomic configuration and molecular structure of a substance based on a decay signal of induced electromotive force caused by resonance precession of nuclear magnetic moment induced by irradiation of electro-magnetic pulses in an RF region when the substance is exposed to a strong magnetic field; and a vibration isolation mechanism for suppressing vibration of this nuclear magnetic resonance means, wherein the vibration isolation mechanism has an air spring as an actuator, the air spring being connected to a pressurized air source via an electro-pneumatic converter and acting to exert a force for vibration isolation on the nuclear magnetic resonance means, and the vibration isolation mechanism is formed so as to be capable of active vibration isolation, and the electro-pneumatic converter is accompanied by a means for decaying a magnetic field leaking outside from the nuclear magnetic resonance means and is disposed at such a position that the leakage magnetic field is decayed, and wherein a control means in the vibration isolation mechanism performs such a control that controlling pressure generated by the electro-pneumatic converter is lowered at around a fluid resonance frequency so as to suppress occurrence of fluid resonance between the air spring and the electro-pneumatic converter.

8. The nuclear magnetic resonance apparatus as claimed in claim 7, wherein the air spring and piping system are formed of nonmagnetic material.

9. The nuclear magnetic resonance apparatus as claimed in claim 7, wherein the vibration isolation mechanism includes a piezoelectric acceleration sensor as a vibration detection means.

10. The nuclear magnetic resonance apparatus as claimed in claim 7, wherein the vibration isolation mechanism includes a servo acceleration sensor as a vibration detection means, and this servo acceleration sensor includes a means for decaying a magnetic field leaking outside from the nuclear magnetic resonance means and is disposed at such a position that the leakage magnetic field is decayed.

11. A nuclear magnetic resonance apparatus comprising: a nuclear magnetic resonance means for elucidating atomic configuration and molecular structure of a substance based on a decay signal of induced electromotive force caused by resonance precession of nuclear magnetic moment induced by irradiation of electro-magnetic pulses in an RF region when the substance is exposed to a strong magnetic field; and a vibration isolation mechanism for suppressing vibration of this nuclear magnetic resonance means, wherein the vibration isolation mechanism has an air spring as an actuator, the air spring being connected to a pressurized air source via an electro-pneumatic converter and acting to exert a force for vibration isolation on the nuclear magnetic resonance means, and the vibration isolation mechanism is formed so as to be capable of active vibration isolation, and the electro-pneumatic converter is disposed so as to generate a driving magnetic field perpendicular to a direction of a leakage flux from the nuclear magnetic resonance means.

12. The nuclear magnetic resonance apparatus as claimed in claim 11, wherein the air spring and piping system are formed of nonmagnetic material.

13. The nuclear magnetic resonance apparatus as claimed in claim 11, wherein a control means in the vibration isolation mechanism performs such a control that controlling pressure generated by the electro-pneumatic converter is lowered at around a fluid resonance frequency so as to suppress occurrence of fluid resonance between the air spring and the electro-pneumatic converter.

14. The nuclear magnetic resonance apparatus as claimed in claim 11, wherein the vibration isolation mechanism includes a piezoelectric acceleration sensor as a vibration detection means.

15. The nuclear magnetic resonance apparatus as claimed in claim 11, wherein the vibration isolation mechanism includes a servo acceleration sensor as a vibration detection means, and this servo acceleration sensor includes a means for decaying a magnetic field leaking outside from the nuclear magnetic resonance means and is disposed at such a position that the leakage magnetic field is decayed.

* * * * *